United States Patent
Ng

(10) Patent No.: US 11,532,761 B2
(45) Date of Patent: Dec. 20, 2022

(54) COMPOSITE MASKING BETWEEN SOLAR CELLS

(71) Applicant: SunPower Corporation, San Jose, CA (US)

(72) Inventor: Hoi Hong Ng, San Jose, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 17/338,483

(22) Filed: Jun. 3, 2021

(65) Prior Publication Data

US 2021/0384363 A1 Dec. 9, 2021

Related U.S. Application Data

(60) Provisional application No. 63/034,761, filed on Jun. 4, 2020.

(51) Int. Cl.
*H01L 31/0216* (2014.01)
*H01L 31/05* (2014.01)

(52) U.S. Cl.
CPC .... *H01L 31/02167* (2013.01); *H01L 31/0508* (2013.01); *H01L 31/0512* (2013.01)

(58) Field of Classification Search
CPC ............. H01L 31/0512; H01L 31/0516; H01L 31/02167
See application file for complete search history.

(56) References Cited

U.S. PATENT DOCUMENTS

| | | | |
|---|---|---|---|
| 7,390,961 B2 | 6/2008 | Aschenbrenner et al. | |
| 9,691,924 B1 | 6/2017 | Rose et al. | |
| 10,205,039 B2 | 2/2019 | Mitsuzawa et al. | |
| 2005/0268959 A1* | 12/2005 | Aschenbrenner | H01L 31/0508 136/244 |
| 2010/0108123 A1 | 5/2010 | sberg et al. | |
| 2011/0073165 A1 | 3/2011 | Lee | |
| 2014/0102515 A1 | 4/2014 | Sakuma et al. | |
| 2014/0246068 A1 | 9/2014 | Krokoszinski et al. | |
| 2015/0007876 A1* | 1/2015 | Komai | H01L 31/02008 136/256 |
| 2016/0093757 A1 | 3/2016 | Pass et al. | |
| 2016/0149065 A1 | 5/2016 | Pass | |
| 2016/0268964 A1 | 9/2016 | Maekawa et al. | |
| 2016/0380132 A1 | 12/2016 | Sewall et al. | |
| 2017/0148942 A1* | 5/2017 | Van Roosmalen | H01L 31/0547 |
| 2017/0323988 A1 | 11/2017 | Kim et al. | |
| 2018/0062016 A1 | 3/2018 | Hyun et al. | |
| 2018/0198011 A1 | 7/2018 | Jeon et al. | |
| 2019/0312166 A1* | 10/2019 | Lu | H01L 31/182 |

FOREIGN PATENT DOCUMENTS

| | | |
|---|---|---|
| JP | 2006028803 A | 2/2006 |
| JP | 2013098486 A | 5/2013 |
| KR | 20150083748 A | 7/2015 |
| KR | 20180105837 A | 10/2018 |
| WO | 2013168612 A1 | 11/2013 |

* cited by examiner

*Primary Examiner* — Golam Mowla

(74) *Attorney, Agent, or Firm* — Grasso PLLC

(57) ABSTRACT

Composite making regions are provided. These masking regions can include layers or other areas of different transparency where a first region has a first transparency and a second region has a different transparency. Masking regions can be positioned between adjacent photovoltaic cells of photovoltaic arrays.

20 Claims, 7 Drawing Sheets

COMPOSITE MASKING BETWEEN SOLAR CELLS

RELATED APPLICATION

This application claims priority to provisional application U.S. 63/034,761, which was filed on Jun. 4, 2020 and is entitled Composite Masking Between Solar Cells. The '761 application is incorporated herein in its entirety by reference.

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collected from all of the PV cells can be combined in series and parallel arrangements, to provide power with a certain voltage and current. These arrangements may include electrical interconnections between solar cells.

DETAILED DESCRIPTION

Figure 1:
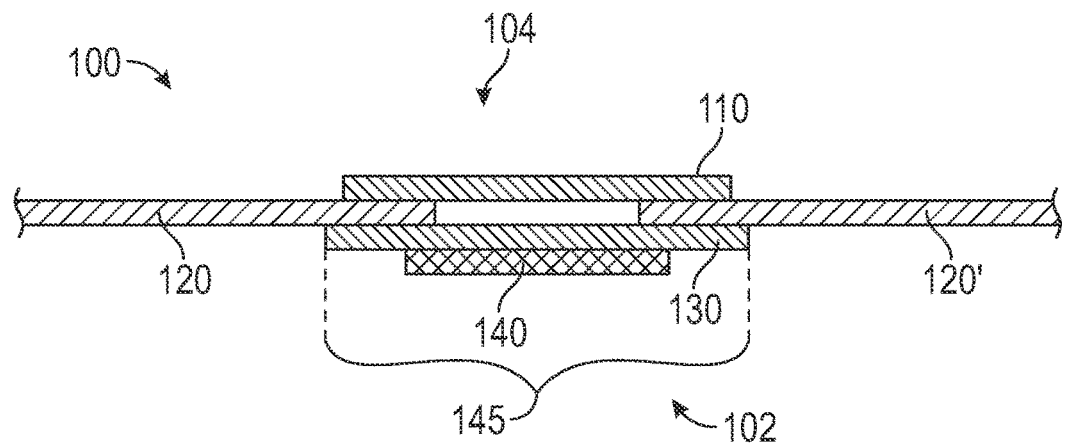
FIG. 1 illustrates a cross-sectional view of composite masking regions as can be employed according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics can be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components can be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112(f) for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead, the term "first" is used to differentiate this solar cell from another solar cell (e.g., a "second" solar cell).

"Based On." As used herein, this term is used to describe one or more factors that affect a determination. This term does not foreclose additional factors that can affect a determination. That is, a determination can be solely based on those factors or based, at least in part, on those factors. Consider the phrase "determine A based on B." While B can be a factor that affects the determination of A, such a phrase does not foreclose the determination of A from also being based on C. In other instances, A can be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it can completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

"Intervening layer" or "insulating layer" describes a layer that provides for electrical insulation, passivation, and/or inhibits light reflectivity. An intervening layer can be several layers, for example a stack of intervening layers. In some contexts, the intervening layer can be interchanged with a tunneling dielectric layer, while in others the intervening layer is a masking layer or an "antireflective coating layer" (ARC layer). Exemplary materials include silicon nitride, silicon oxynitride, silicon oxide (SiOx), silicon dioxide, aluminum oxide, amorphous silicon, polycrystalline silicon, molybdenum oxide, tungsten oxide, indium tin oxide, tin oxide, vanadium oxide, titanium oxide, silicon carbide and other materials and combinations thereof. In an example, the intervening layer can include a material that can act as a moisture barrier. Also, for example, the insulating material can be a passivation layer for a solar cell. In an example the intervening layer can be a dielectric double layer, such as a silicon oxide ($SiO_x$), for example with high hydrogen content, aluminum oxide ($Al_2O_3$) dielectric double layer.

"Locally deposited metal" and "metal deposition" are used to describe forming a metal region by exposing a metal source to a laser that forms and/or deposits metal from the metal source onto portions of a substrate. This process is not limited to any particular theory or mechanism of metal deposition. In an example, locally deposited metal can be formed upon exposure of a metal foil to a laser beam that forms and/or deposits metal from the metal foil, such as all of the metal foil exposed to the laser beam, onto portions of a silicon substrate. This process can be referred to as a "Laser Assisted Metallization Patterning" or LAMP technique. The locally deposited metal can have a thickness of approximately 10 nm to 10 microns, a width approximately defined by the laser beam size, and physical and electrical properties matching those of the source metal foil.

"About" or "approximately". As used herein, the terms "about" or "approximately" in reference to a recited numeric value, including for example, whole numbers, fractions, and/or percentages, generally indicates that the recited numeric value encompasses a range of numerical values (e.g., +/−5% to 10% of the recited value) that one of ordinary skill in the art would consider equivalent to the recited value (e.g., performing substantially the same function, acting in substantially the same way, and/or having substantially the same result).

"Opaque". As used herein, the term "opaque" refers to a property of light transmissibility. Different degrees of opacity are possible. 100% opacity, i.e., 0% light transmissibility, is not required for a material used herein to be considered "opaque"; rather, increased opacity relative to nearby materials, such as underlying materials, is required. Materials may have varying degrees of opacity, retardation of the transmission of light, visible as well as invisible light bandwidths, ranging from approximately 50% opaque to 100% opaque, e.g.: 50%, 55%, 60%, 65%, 70%, 75%, 80%, 85%, 90%, 95%, 99%, and 100%.

"Transparent". As used herein, the term "transparent" refers to a property of light transmissibility. Different degrees of transparency are possible. 100% transparency, i.e., 100% light transmissibility, is not required for a material used herein to be considered "transparent"; rather, increased transparency relative to nearby materials, such as overlying materials, is required. Materials may have varying degrees of transparency, transmission of light, visible as well as invisible light bandwidths, ranging from approximately 50% transparent to 100% transparent, e.g.: 50%, 55%, 60%, 65%, 70%, 75%, 80%, 85%, 90%, 95%, 99%, and 100%.

In addition, certain terminology can also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology can include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure can be practiced without these specific details. In other instances, well-known techniques are not described in detail in order to not unnecessarily obscure embodiments of the present disclosure.

This specification describes exemplary composite masking regions, which can be placed over gaps between adjacent solar cells in order to mask those gaps as well as mask any electrical interconnects spanning those gaps. In embodiments, PV cells, i.e., solar cells, are regularly placed next to each other in a grid pattern, in a non-grid pattern, randomly, or otherwise, when assembling a PV panel. A gap can exist between adjacent cells when laid out this way. The cells may be connected to each other or to at least one other cell using electrical interconnects (e.g., metallizations). These interconnects and the gaps may be visible on an assembled PV panel.

A photovoltaic laminate may house the PV cells and the PV panel in embodiments. In other words, a laminate of transparent, and/or opaque materials may be positioned above and/or below the solar cells in embodiments. This laminate material may serve to protect the solar cells from environmental hazards while also allowing for sunlight to reach the solar cells. The laminate material may include glass, clear polymers, and/or other materials.

Embodiments can include composite masking regions, such as layers, with different light transmitting properties. These light transmitting properties can differ from one face of the masking layer or other region to an opposite face of the masking layer or other region. These composite masks can be striated with layers or other regions of different transparency and/or opacity and these layers or other regions can have discrete borders or, in some embodiments, may not have discrete borders. These regions, which can be layers, can also have different widths as well as different sizes and shapes. In some embodiments, an outermost layer or other region can have a narrower width than a different layer or other region of the composite masking layer or other region. In some composite masking layers, or other region, an outermost layer can be wider than a different layer or other region. The layers or other regions can be detachable from each other and discrete as well as integrated or inseparable from other layers or other regions having different properties or made from different materials. As used herein, in an embodiment, the masking regions can be referred to as regions, masking layers, and/or layers.

Embodiments can be positioned above or otherwise near interconnects (e.g., metallizations) between solar cells. In embodiments, one region, e.g., a layer, or a portion of a layer can include a transparent material that serves to affix to the cell while also limiting the amount of cell shading attributable to the transparent material. In embodiments, the region can include various types of materials. In an example, a layer can include a laminated film and/or a light redirecting material. In embodiments, a layer or other region can include any shape or configuration. In an example, a first layer or other region can include a square, circular, oblong, rectangular, triangular, trapezoidal, hyperboloid, polygonal, and/or any other type of shape. In embodiments, a layer or other region can be positioned so as to be located over a gap or other spacings between adjacent solar cells. In embodiments, the first layer can be the shape and size same as, follow, or conform to the shape of the gap or space between adjacent solar cells. In embodiments, a layer or other region can be located over an interconnect between solar cells. In embodiments, a layer or other region can partially cover the interconnect. In embodiments, the first layer can be the same shape and size as, follow or conform to the shape of the interconnect. In embodiments, the first layer can have a dog bone shape (e.g., see 1210 of FIG. 6). The first layer may be referred to as an adhesion layer.

In embodiments, another, e.g., second or top, layer can also be employed where this layer can include an opaque material that can serve to cloak the metallizations or interconnects between solar cells. One or more second or top layers may be employed. These second or top layers or other regions can include a coating, a laminated film, light redirecting film, and/or other materials wherein this layer(s) is preferably less transparent than the adhesion layer. This second layer or top layer or other region can be positioned so as to cover or visually obstruct a gap or other spacings between adjacent solar cells. In an embodiment, the second or top layers or other regions can visually obstruct an interconnect between solar cells. In embodiments, the second layer can include any shape or configuration. In an example, the second layer can include a square, circular, oblong, rectangular, triangular, trapezoidal, hyperboloid, polygonal, and/or any other type of shape. In embodiments, transparent layers may be made of Polyethylene Terephthalate (PET) or other transparent plastic that is considered UV stable. In embodiments, opaque layers may comprise various materials and may be applied to various materials. In other words, the opaque layers may comprise opaque materials or may be made opaque through the addition of additional materials through painting or printing or other process. These additional processes and/or materials may comprise: acrylic ink, epoxy ink, polyurethane ink colored by various pigments. Laminated film, such as pigmented plastic like PET, may also be employed.

In embodiments, various lamination methods can be employed to assemble composite masks. These methods can include using multiple pieces of material, elongated continuous pieces of material such as tape, or other layering material, each having the same or differing transparent properties, and laminating two or more of the layers together. These layers can be uniformly laminated together and can be nonuniformly laminated together. For example, an upper, narrower layer can be laminated along the centerline of a lower layer as well as positioned off-center from the lower layer. The position of the layers can depend on the anticipated gaps between solar cells that are to be covered. These methods can also include applying the layers one at a time during assembly of a solar module with multiple solar cells. In other words, a base layer having a first transparency can be applied over a gap between two solar cells and a second layer, having less transparency can then be applied over this first layer. Additional layers having similar or different properties may be applied.

In embodiments, masking layers or other regions can also be placed using ink-jet printing technologies, roller technologies, and other inking technologies as well. For example, a base substrate can be placed across a gap of adjacent solar cells and the transparency of this substrate layer can be reduced to approximately zero over a portion of the width of the layer by placing ink over a central portion of the substrate layer. In so doing, the outer edges of the substrate layer can be transparent but the central portion of the substrate can be opaque and positioned so as to prevent seeing some or all interconnects between solar cells from a front surface or a back surface of a solar panel containing the solar cells. In some embodiments, the masking layers or other regions can also be placed using screen printing, spin coating, and/or any other type of printing or deposition process can be used.

In embodiments, printing may also be undertaken after a transparent layer placement over an interconnect. In this way, an opaque layer (ink) width can be adjusted in some embodiments based on various gap sizing between two cells due to different gap design. Also, printing after a transparent layer placement may be accommodating to variations in gap sizing resulting from manufacturing variation.

The interconnects of embodiments can include any type of electrical conductor or material. In some examples, the interconnects can include an aluminum cut out, metal foil., aluminum foil, wires, aluminum wires and/or any other type of interconnect structure. In an example, the interconnects can include an anodized aluminum spanning the cells. The viability of these interconnects can be checked prior to and after the placement of the composite masking layers or other masking regions. Also, the masking can be applied before or after the installation of interconnects.

Light, heat, pressure-sensitive adhesive, and/or other bonding accelerants can be employed to bind a masking layer or masking region to a solar cell as well as to bind layers or other regions of a mask to each other. The layers can be uniform in thickness and can have different thicknesses in a layer as well as when comparing layers. These thicknesses can be approximately 30 microns well as more and less thick. E.g., approximately 1 µm, 3 µm, 5 µm, 10 µm, 15 µm, 35 µm, 45 µm, etc. For example, transparent film thicknesses may range from approximately 25-125 microns and opaque layers may range from approximately 1-15 microns for printed or painted layers or regions and approximately 25-125 microns for laminated layers or regions.

Masking regions may comprise tape or other cloaking materials with pressure sensitive adhesives to adhere the masking material above or around the interconnect to be masked. The tape may be made from various materials including PET (Polyethylene Terephthalate), ETFE (a copolymer of ethylene and tetrafluoroethylene) and other polymer or non-polymer materials. Resiliency and toughness are properties that the materials comprising the tape or other mask may comprise.

As noted above, ink may be employed as an opaque cloaking material. Some cloaking materials, including ink, may employ high reflectivity, may be UV stable, and may have characteristics that serve to slow or prevent yellowing of the substrate. This ink may be placed after the interconnection has been covered with a layer of material serving as a portion of the cloaking material or other purpose. This ink may be placed on tape or other cloaking material before the cloaking material is placed over the interconnect to be shielded. Thus, a tape with different transparencies may be employed in embodiments as a masking region. An edge or center portion of the tape may be opaque and this opaque portion may then be placed over the interconnects to be hidden. In some embodiments, two or more layers of tape may be used. A first layer of transparent material to completely cover the interconnection and a second opaque layer to mask a portion of the interconnection being masked from being visible from a side of the PV module.

Some embodiments may have interconnections along strings of PV cells but not necessarily between strings of PV cells. These interconnections may be masked as taught herein. In some embodiments, however, strings of PV cells may be interconnected as well and these interconnections may be masked as well. In embodiments, some but not all PV cell interconnections of a PV module may be masked, while in some embodiments, all PV cell interconnections of a PV module may be masked.

FIG. 1 illustrates a cross-sectional view of a composite mask as may be employed according to some embodiments. In embodiments, the composite mask 145 can include a first layer 130 and a second layer 140. In embodiments, the first layer 130 can include a transparent material that serves to affix to a plurality of solar cells 100 while also limiting the amount of cell shading attributable to the transparent material. In embodiments, the second layer 140 can include an opaque material that can serve to cloak metallizations or other interconnections 110 between solar cells of the plurality of solar cells 100. In embodiments, cloaking can also be referred to as covering, hiding, or obstructing from view. In embodiments, the plurality of solar cells 100 can include individual solar cells 120 adjacent and/or near to one another. In embodiments, the plurality of solar cells can refer to a solar cell string as well as a matrix of solar cells. In an embodiment, the plurality of solar cells 100 can include a front side 102 and a back side 104, where the front side 102 is opposite the back side 104. In embodiments, the second layer 140 of a composite mask 145 can be positioned so as to cover a gap or spacing between adjacent solar cells 120 of the plurality of solar cells 100. This second or top layer 140 may be wide in comparison to other layers or regions so as to increase the placement accuracy tolerance during assembly. In other words, a wider layer or region 140 can allow for a lesser amount of accuracy during manufacture. In embodiments, the transparency of the first layer 130 can be reduced to zero over a portion of the width of the first layer 130 by placing the second layer 140 over a central portion of the first layer 130. In so doing, the outer edges of the first layer 130 can be transparent but the central portion or second layer 140 can be opaque and positioned so as to prevent seeing some or all interconnects 110 between the plurality of solar cells 100 from the front side 102. In embodiments, the layers 130, 140 can be uniform in thickness and/or can have different thicknesses. In an example, opaque material can serve to obstruct the view of metallizations or other interconnects 110 from a front side of a solar panel. In embodiments, layer thicknesses can be approximately 30 μm as well as more and less thick. E.g., approximately 1 μm, 3 μm, 5 μm, 10 μm, 15 μm, 35 μm, 45 μm, etc.

Referring again to FIG. 1, in embodiments, the interconnections 110 can include any type of electrical conductor material. In some examples, the interconnections 110 can include an aluminum cut out, metal foil (such as aluminum foil and/or copper foil), wires, aluminum wires, copper wires, and/or any other type of interconnect structure. In an example, the interconnections can include an anodized aluminum spanning the cells. In embodiments, a composite mask may be present between solar cells 120 even though the particular solar cells 120 are not interconnected with an interconnection. These shapes may vary and may include dog bone mask configurations as shown herein as well as rectangular, polygonal, square, circular, elliptical, oval, and other configurations suited to provide masking properties as described herein.

Figure 2:
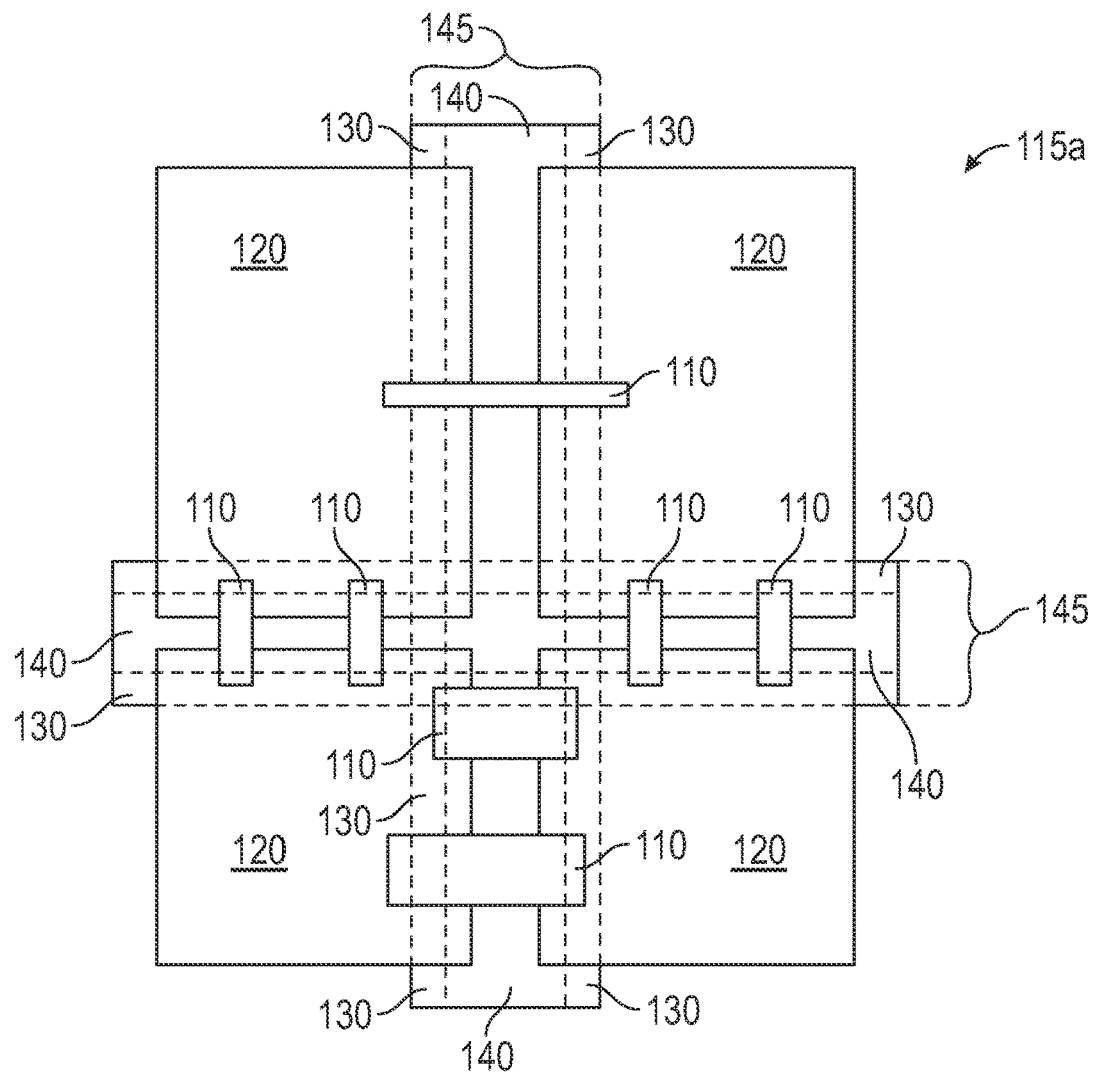
FIG. 2 illustrates a bottom view of multiple solar cells and multiple composite masking regions as can be employed according to some embodiments.

FIG. 2 illustrates a bottom view of multiple solar cells 120 and multiple composite masking regions 145 as may be employed according to some embodiments. The four solar cells shown are oriented in a two-dimensional matrix layout. The solar cells 120 are connected as two strings with interconnections 110 and these strings are also connected to each other with interconnections 110. The masking regions 145 span the gaps between the strings and the gaps in each string. As can be seen, the masking regions 145 comprise transparent cloaking first layer 130 and opaque cloaking second layer 140. The opaque cloaking second layer 140 is shown as being narrower than the transparent cloaking first layer 130 but is also shown as being wider than the gaps between solar cells 120 of the same string and the gaps between solar cells 120 of adjacent strings. Thus, the composite mask covers the interconnections 110 as well as gaps between solar cells in certain embodiments.

Figure 3:
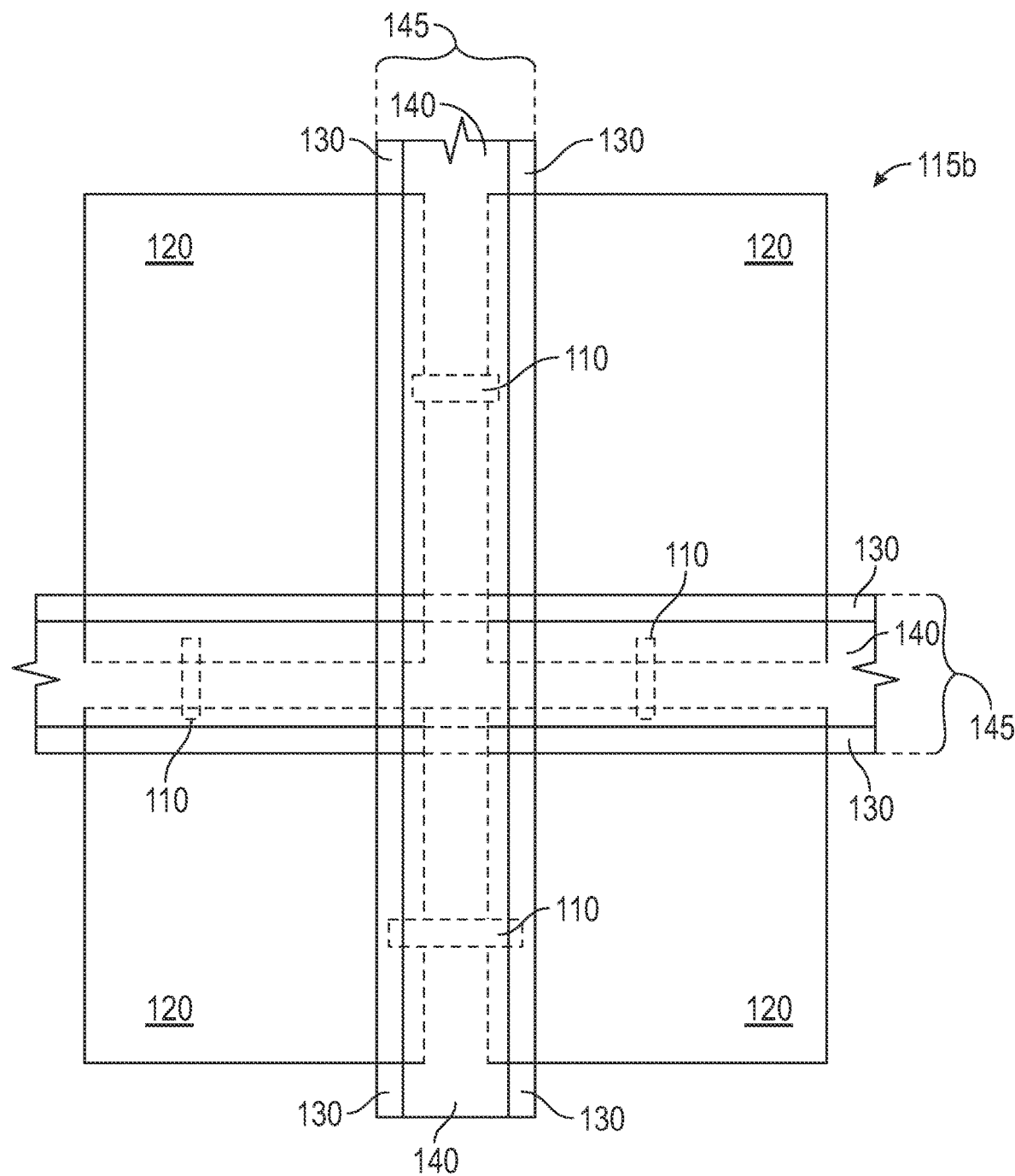
FIG. 3 illustrates a top view of multiple solar cells and multiple composite masking regions as can be employed according to some embodiments.

FIG. 3 illustrates a top view of multiple solar cells and multiple composite masking regions as can be employed according to some embodiments. As can be seen, the composite mask 145 spans the gap between solar cells 120 of the same string and of adjacent strings. Likewise, the interconnections 110 are not visible from above because of the positioning of composite masking regions. In this view, the interconnections 110 are shown to be shorter than the width of the masking regions, however, in embodiments, these interconnections may be longer as well. In either instance, the interconnections in such embodiments would not be visible when viewed from above.

Referring again to FIGS. 2 and 3, in embodiments, the multiple solar cells can be electrically connected by a plurality of interconnections 110. In embodiments, the multiple solar cells electrically connected by a plurality of interconnections 110 can be referred to as a solar cell matrix 115a/115b. In embodiments, the solar cell matrix 115a/115b can include a plurality of solar cell strings, as described above. In embodiments, the solar cell matrix 115a/115b can include a plurality of individual solar cells 120. In embodiments, the plurality of solar cells 120 can be electrically connected by the plurality of interconnections 110. In an embodiment, a single interconnect from the plurality of interconnections 110 can be used to electrically connect one solar cell 120 to another solar cell as shown. In embodiments, two or more interconnections 110 of the plurality of interconnects can be used to electrically connect two solar cells. In embodiments, although 4 solar cells are shown electrically connected by the plurality of interconnects, instead two solar cells can be connected by a single interconnection. In an example, at least two solar cells 120 can be connected in series or parallel electrical configuration. Although as shown, each solar cell 120 is connected to at least two other solar cells, in embodiments, a solar cell 120 can be connected to at least one other solar cell. In embodiments, the present layering and/or masking may be employed with any solar cell configuration having visible interconnections 110. In embodiments, the present layering and/or masking may be employed with any solar cell configuration having gaps, even if visible interconnections are not present.

Figure 4:
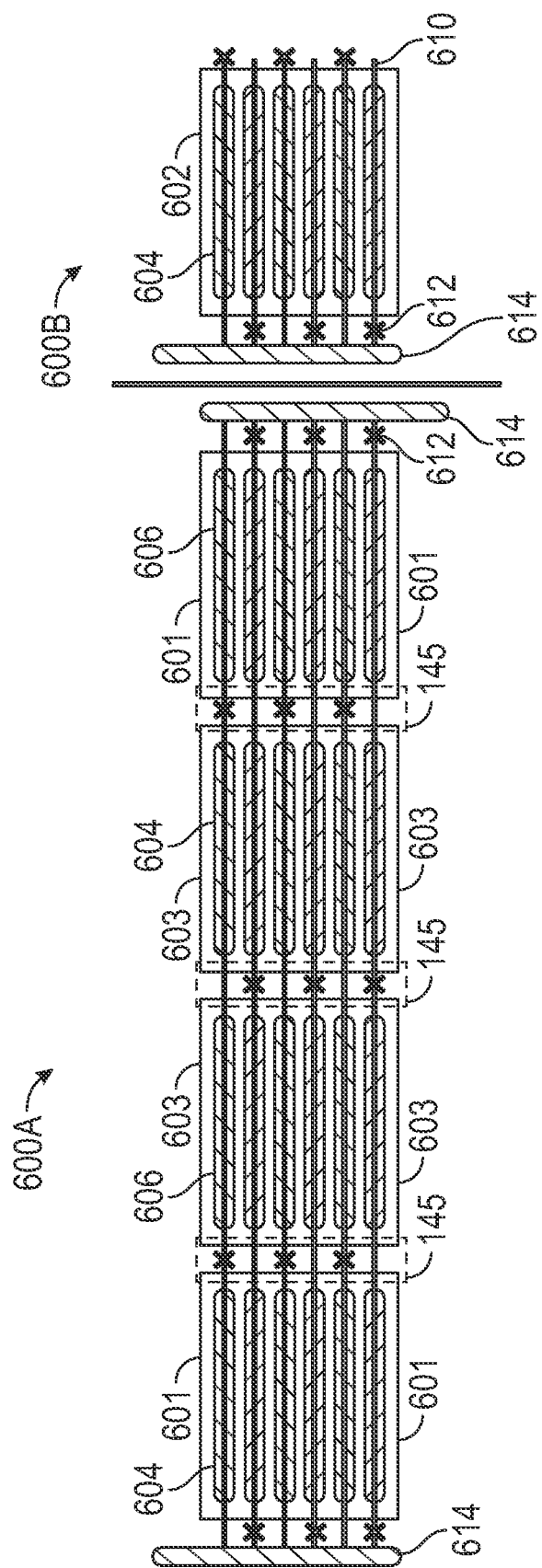
FIG. 4 illustrates a bottom view of a solar cell string including wire structure connections and composite masking regions as can be employed according to some embodiments.

FIG. 4, a bottom view, illustrates a solar cell string including wire structure connections and a composite mask as may be employed in embodiments. The solar cell string 600A illustrated in FIG. 4 includes a plurality of solar cells 601 and 603 that are electrically coupled together in series. The solar cell string 600A has two end solar cells 601, and inner solar cells 603 connected in series between the two end solar cells 601. In embodiments, the solar cell string 600A can include a composite mask 145 between solar cells 601, 602 and 603 as shown. In embodiments, the composite mask 145 can include a first layer and a second layer as described in detail herein. Each of the two end solar cells 601 is shown as electrically coupled with a busbar 614. At each of the end solar cells 601, every other one of the wires is coupled with a busbar 614 to couple only one of the two electrodes of the end solar cell, either the P-type doped diffusion regions 604 or the N-type doped diffusion regions 606. In one embodiment, the coupling of every other one of the wires from an end solar cell 601 with a busbar 614 can be achieved by first cutting 612 all the wire at each end of the string, and connecting only the wires for either the P-type or N-type doped diffusion regions. In some embodiments, all the wires for an end solar cell 601 can first be connected to a busbar 614, and then every other wire can be cut.

Only the end solar cells 601 are connected to a busbar 614, in contrast to other stringing techniques which can involve attaching busbar(s) to each solar cell, according to some embodiments. The busbars 614 can couple the solar string 600A with another solar string (e.g., such as the solar string 600B), or to another circuit (e.g., a circuit outside the module through a junction box).

As illustrated in FIG. 4, which is a bottom view, embodiments having a given cut section of wire may be used to electrically couple at most two solar cells together in series, wherein the P-type doped diffusion area of one of the two solar cells is connected to the N-type doped diffusion area of the other solar cell. However, other embodiments can include more than two solar cells being coupled together with a given cut section of wire. For example, if solar cells are connected in parallel, it is possible to connect more than two cells with a given cut section of wire.

Also as illustrated in FIG. 4, as may be employed in certain embodiments, a cut section of wire that electrically couples an end solar cell 601 to the busbar 614 may couple a single solar cell to the busbar 614. However, as mentioned above, in embodiments that connect solar cells in parallel, a given cut section of wire can connect more than a single solar cell to the busbar. Thus, a solar string, hypercell, or super cell, can be created using the plurality of wires 610 by aligning and bonding the wires over the P-type and N-type doped diffusion regions of each of the solar cells, followed by cutting some of the wires to achieve the desired configuration of solar cells in a string. Thus, in accordance with one or more embodiments of the present disclosure, a stringing method provides a structure having compressed wires where every second wire is cut 612 between wafers and bus bars at ends. It is to be appreciated that portions of the compressed wires between solar cells are not compressed. In embodiments, the wires that are not cut between solar cells have a different cross-section on the solar cells than between the solar cells. These various connection structures and techniques may each be masked with one or more composite masks as taught herein.

Figure 5A:
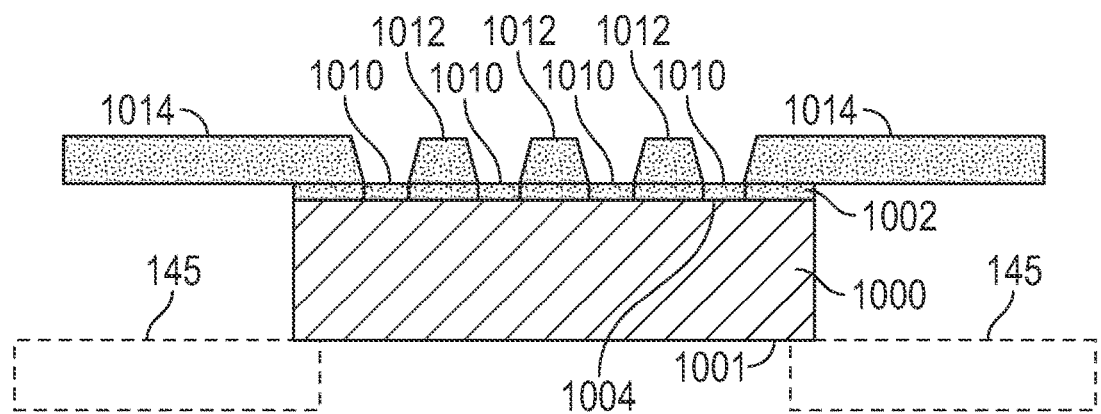
FIG. 5A-5B illustrate a side view of a solar cell including foil structure connections and composite masking regions as can be employed according to some embodiments.
Figure 5B:
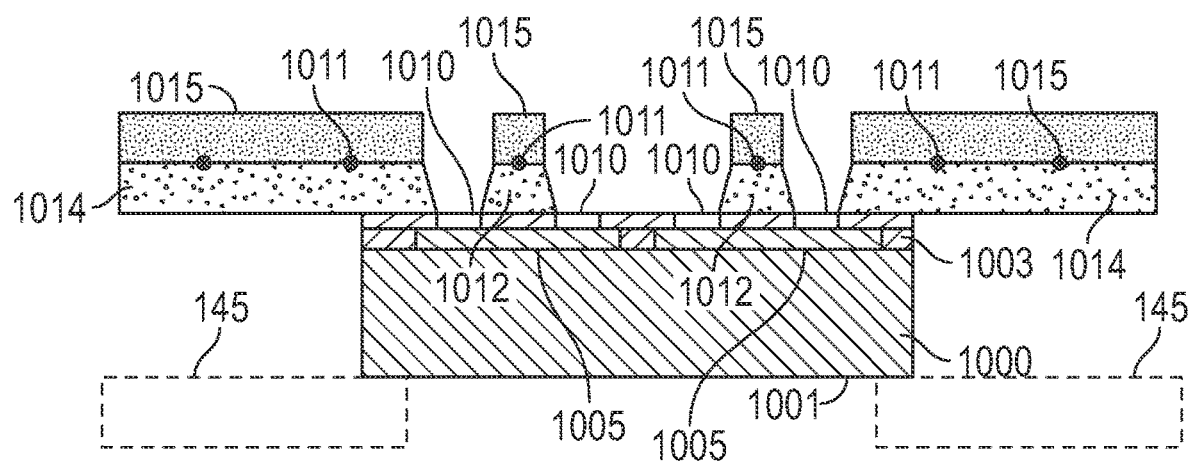

FIGS. 5A-5B, a side view, illustrate foil structure connections that can include a composite mask 145 according to some embodiments. These foil structure connections may be formed through laser etching. Such etching may expose metal foil to a laser beam to form a plurality of conductive contact structures 1010 electrically connected to the semiconductor regions in or above the substrate 1000. In embodiments, the foil structures can include a locally deposited metal. As shown, the edge portions 1014 can also be referred to as interconnect portions that can electrically connect one solar cell to another solar cell. In one example, coupling one solar cell to another solar cell in this manner can form a solar cell string, achieving a parallel or series electrical relationship between the cells. In a particular embodiment, the overhang portion can represent a foil portion that is sufficiently large to overlap with one or more additional cells for metallization of the one or more additional cells. In an embodiment, a single piece and/or sheet of foil can be used for a plurality of solar cells (e.g., 2, 3 or more solar cells) in this manner. In an embodiment, two or more cells can be connected together by their respective edge portions 1014. For example, the edge portions 1014 from adjacent cells can be connected by various processes. In another example, substrates 1000 can have individual edge portions 1014. These individual edge portions 1014 can be bonded and/or welded together to electrically connect one substrate to another, e.g., to form a solar cell string such as a super cell or hypercell. In some examples, the individual edge portions 1014 can be attached together using a conductive adhesive, tacking process, stamping process and/or any other type of applicable attachment process. Also labelled in FIGS. 5A and 5B are contact structures 1010, intervening layer 1002, light receiving side 1001, metal source 1015, bond 1011, metal foil portion 1012, and metal foil portion 1003. Accordingly, in embodiments, a composite mask 145 can cover the individual interconnect or edge portions 1014 as shown. In embodiments, the composite mask 145 can include a first layer and a second layer as described in herein.

Figure 6:
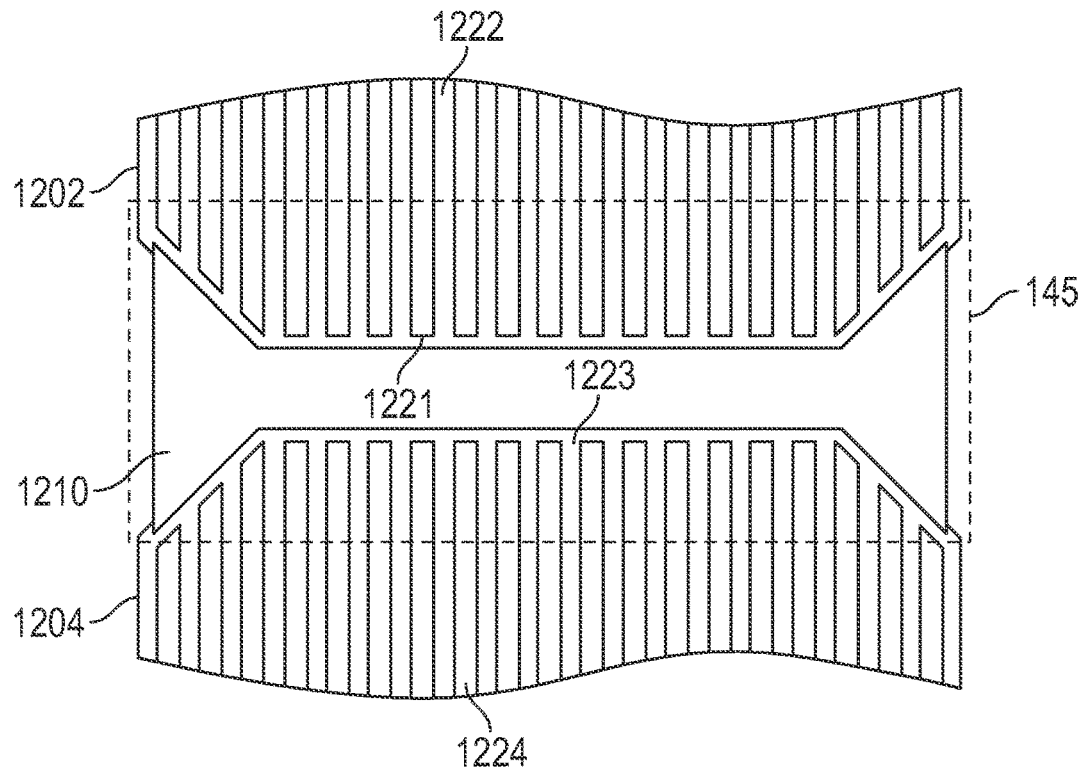
FIG. 6 illustrates a top view of solar cell string including a dog bone connection and composite masking region as may be employed according to some embodiments.

FIG. 6 illustrates a dog-bone connection that can include a composite mask according to some embodiments. The first interconnection 1210 can have a dog-bone shape as shown. FIG. 6 shows a single interconnection having that shape rather than multiple interconnects collectively having that shape. As shown, the solar cells in the example of FIG. 6 are pad-less solar cells 1202, 1204. In some embodiments, the first interconnection 1210 can be welded to metal regions 1221, 1223 of the solar cells 1202,1204. In some embodiments, a laser process can be used to weld the first interconnect 1210 to metal regions 1221, 1223 of the first and second solar cell 1202, 1204. In some embodiments, the metal regions 1221, 1223 can include contact fingers 1222, 1224. In some embodiments, first interconnection 1210 can include a metal foil. In some embodiments, first interconnection 1210 can include aluminum and/or aluminum foil. In some embodiments, the first interconnection 1210 can be substantially planar with the metal regions 1221, 1223 and/or the first and second solar cell 1202, 1204. In some embodiments, to connect pad-less solar cells 1202, 1204 together, a tab-less interconnect can be used, such as the one illustrated in FIG. 6. In some embodiments, the first interconnect 1210 can have a layer of nickel and/or zincate. In some embodiments, the layer of nickel and/or zincate can be formed by a cladding process. In some embodiments, a composite mask 145 can cover first interconnect 1210 as shown. In some embodiments, the composite mask 145 can include a first layer and a second layer as described herein.

Figure 7:
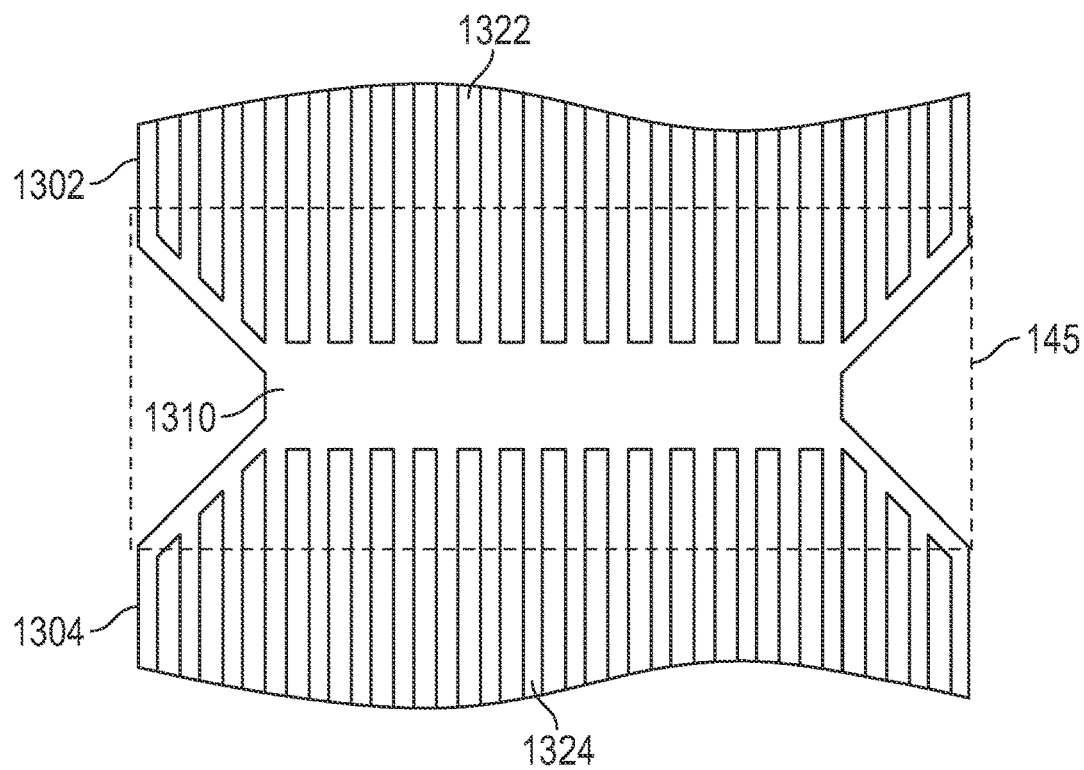
FIG. 7 illustrates a top view of solar cell string including a foil connection and composite masking region as may be employed according to some embodiments.

FIG. 7 illustrates a foil connection that can include a composite mask 145 according to some embodiments. Solar cells connected together by a conductive foil having an anodized region are shown, according to some embodiments. FIG. 7 shows the solar cells 1302, 1304 from back sides of the solar cells 1302, 1304, where the solar cells 1302, 1304 can have front sides which face the sun during normal operation and back sides is opposite the front sides. In some embodiments, the conductive foil 1310 can connect a first solar cell 1302 to a second solar cell 1304. As shown, the solar cells 1302, 1304, in FIG. 7 are pad-less solar cells 1302, 1304. In embodiments, the conductive foil 1310 can include contact fingers 1322, 1324. The conductive foil 1310 can include a metal foil and can be aluminum and an aluminum foil. In some embodiments, the conductive foil 1310 can be rolled over from the first solar cell 1302 to the second solar cell 1304. In some embodiments, a laser process can be used to weld the conductive foil 1310 to the first and second solar cell 1302, 1304. In some embodiments, the conductive foil 1310 can have a layer of copper, titanium, tin, aluminum, nickel and/or zincate. In some embodiments, the layer of nickel and/or zincate can be formed by a cladding process. In some embodiments, the copper and tin can be formed by a plating process. In embodiments, a composite mask 145 can cover conductive foil 1310 as shown. In some embodiments, the composite mask 145 can include a first layer and a second layer as described herein.

Figure 8:
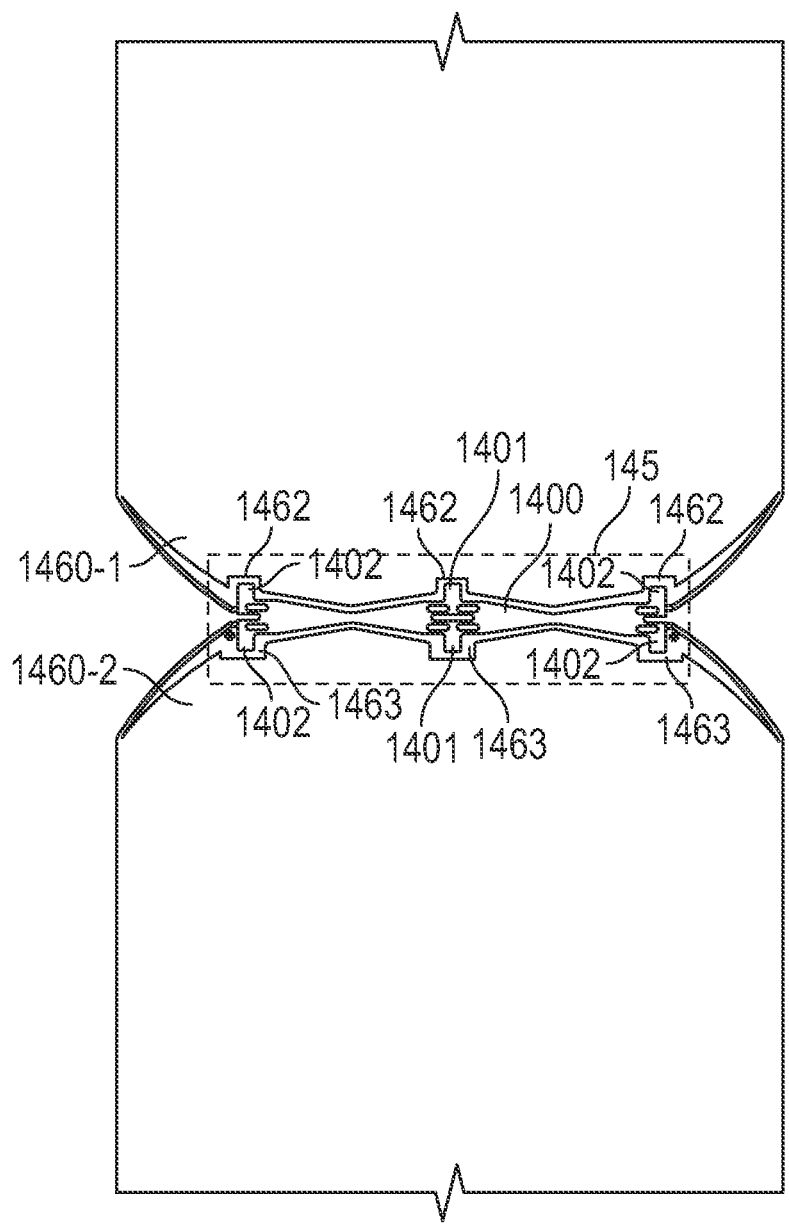
FIG. 8 illustrates a top view of a solar cell string including a dog bone connection and composite masking region as may be employed according to some embodiments

FIG. 8 illustrates a dog-bone connection with a composite mask according to some embodiments. In FIG. 8, tabs 1402 and 1401 of the interconnection 1400 electrically connect positive pads 1463 of the solar cell 1460-2 to the negative pads 1462 of the solar cell 1460-1, on the back sides of the solar cells. The front side of a solar cell faces the sun to collect solar radiation during normal operation; the back side is opposite the front side. In embodiments, a composite mask 145 can cover the interconnection 1400 as shown. In embodiments, the composite mask 145 can include a first layer and a second layer as described herein. As can be seen, triangular shaped areas beyond the composite mask 145 are shown. These triangular areas may or may not also be covered with a composite mask in embodiments.

Figure 9:
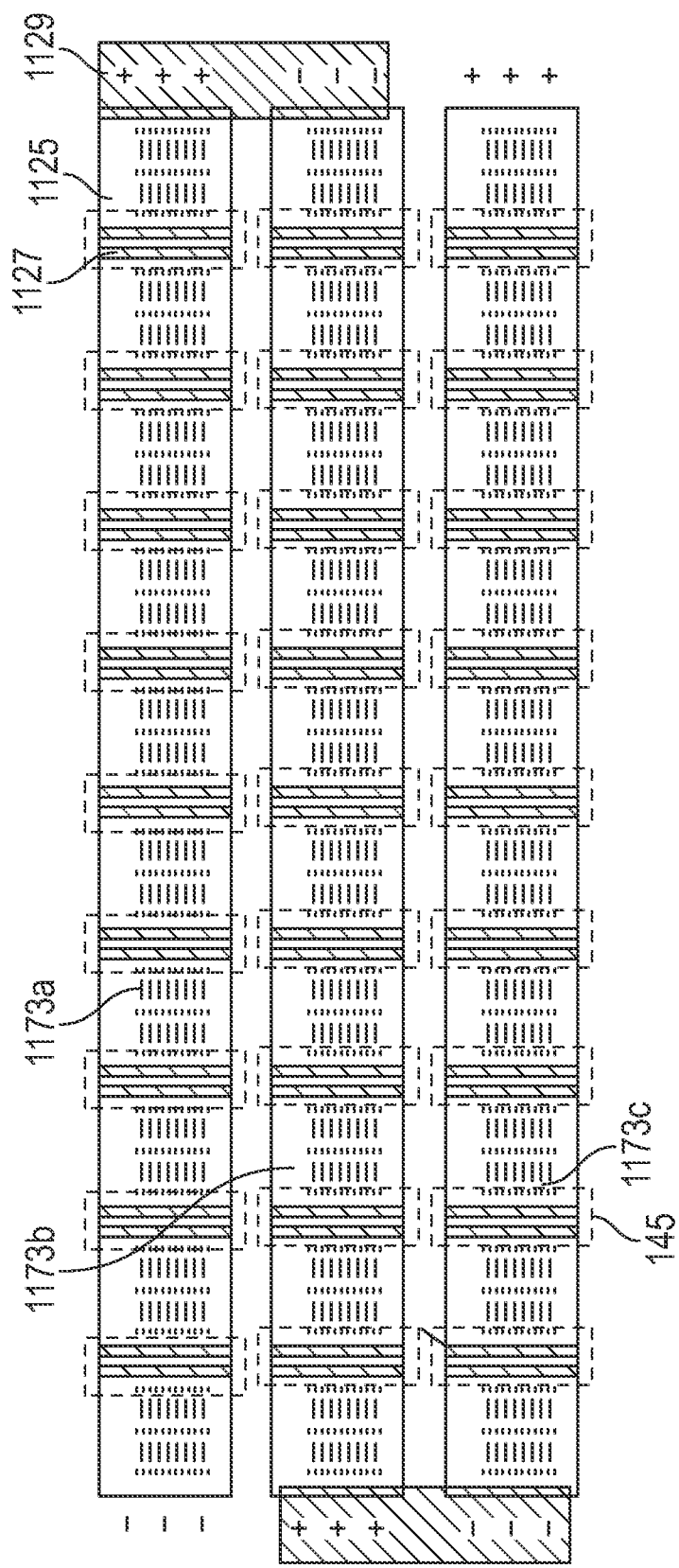
FIG. 9 illustrates a top view of foil structure connections that can include composite masking regions as may be employed according to some embodiments.

FIG. 9 illustrates foil structure interconnections with composite masking according to some embodiments. In FIG. 9, a substantial portion of the metal foil disposed over individual solar cells 1125 can be removed. Portions of metal foil and/or interconnect portions 1127 located between adjacent solar cells 1125 can be maintained to create a set of three solar cell strings 1173a, 1173b, 1173c connected in series. While three solar cell strings 1173a, 1173b, 1173c are shown, a plurality of solar cell strings, e.g., one, two, three, four or more solar cells strings can be connected in this manner. In some embodiments, the interconnecting portions 1127 can be disposed partially over edges of the solar cells 1125 and as well as disposed between solar cells 1125 and can be connected. busbar portions 1129, can connect two or more solar cell strings together as shown. In some embodiments, the busbar portion 1129 can connect the solar cell strings 1173a, 1173b, 1173c in series or parallel arrangements.

In some embodiments, the methods described herein can include forming the interconnecting portions 1127, busbar portions 1129 and/or other portions from the metal foil. For example, with the interconnecting portions 1127 and busbar portions 1129 can include conductive contact structures. The busbar portions 1129 can be rolled, folded and/or trimmed in a subsequent process, after forming locally deposited metal or after a LAMP technique is applied. By rolling, folding or trimming the busbar portions 1129, a space between a solar cell 1125 and an edge of module constructed therefrom can be minimized. In embodiments, a composite mask 145 can cover the metal foil and/or interconnect portions 1127 as shown. In embodiments, the composite mask 145 can include a first layer and a second layer as described in detail above.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure. The scope of the present disclosure includes any feature or combination of features disclosed herein (either explicitly or implicitly), or any generalization thereof, whether or not it mitigates any or all of the problems addressed herein. Accordingly, new claims can be formulated during prosecution of this application (or an application claiming priority thereto) to any such combination of features. In particular, with reference to the appended claims, features from dependent claims can be combined with those of the independent claims and features from respective independent claims can be combined in any appropriate manner and not merely in the specific combinations enumerated in the appended claims.

What is claimed is:

1. A photovoltaic array comprising:
   a plurality of photovoltaic cells,
      wherein at least some of the photovoltaic cells of the plurality of photovoltaic cells are electrically interconnected with a metallization via a gap between adjacent photovoltaic cells,
      wherein each of the photovoltaic cells of the plurality have a front light receiving face and a back face positioned opposite to the front light receiving face, and
   a composite mask, the composite mask having a first width along an upper surface of the composite mask and spanning the gap and a second width along a lower surface of the composite mask and spanning the gap, the first width smaller than the second width, the second width positioned in front of the front light receiving face of at least one photovoltaic cell of the plurality of photovoltaic cells.

2. The photovoltaic array of claim 1 wherein the composite mask has a higher opacity in the first width than the second width.

3. The photovoltaic array of claim 1 further comprising an interconnect located underneath the composite mask.

4. A photovoltaic panel comprising:
   a plurality of photovoltaic cells, each of the photovoltaic cells having a light receiving surface,
      wherein at least some of the photovoltaic cells of the plurality of photovoltaic cells are electrically interconnected with a metallization via a gap between adjacent photovoltaic cells, and
   a composite making layer positioned at least partially in front of the light receiving surface of at least some of the photovoltaic cells of the plurality of photovoltaic cells, the composite masking layer having a first width along a first surface of the composite masking layer and spanning the gap and a second width along a second surface of the composite masking layer and spanning the gap, the first width smaller than the second width.

5. The photovoltaic panel of claim 4 wherein the composite masking layer has a higher opacity in the first width than the second width, and wherein the composite masking layer is positioned in front of the light receiving surface of at least some of the photovoltaic cells of the plurality of photovoltaic cells.

6. A photovoltaic array comprising:
   a plurality of photovoltaic cells, each of the photovoltaic cells having a light receiving surface,
      wherein at least some of the photovoltaic cells of the plurality of photovoltaic cells are electrically interconnected with a metallization via a gap between adjacent photovoltaic cells, and a composite making region spanning the gap and positioned at least partially in front of the light receiving surface of at least some of the photovoltaic cells of the plurality of photovoltaic cells, the composite masking region having a first width along an upper surface of the composite masking region and a second width along a lower surface of the composite masking region, the first width smaller than the second width.

7. The photovoltaic array of claim 6 wherein the composite masking region has a higher opacity in the first width than the second width.

8. The photovoltaic array of claim 6 wherein the gap has a varying width across its length.

9. The photovoltaic array of claim 6 wherein the composite masking region comprises a tape and an ink.

10. The photovoltaic array of claim 6 wherein the composite masking region comprises a first tape and a second tape, the first tape adhesively connected to the second tape.

11. The photovoltaic array of claim 10 wherein the first tape has a uniform thickness and the second tape has a uniform thickness.

12. The photovoltaic array of claim 10 wherein the first tape has a uniform width and the second tape has a uniform width.

13. The photovoltaic array of claim 6 wherein photovoltaic cells of the plurality of photovoltaic cells are arranged adjacent one another in a two-dimensional grid pattern.

14. The photovoltaic array of claim 6 wherein photovoltaic cells of the plurality of photovoltaic cells are arranged adjacent one another in a one-dimensional linear array pattern.

15. A photovoltaic array comprising:

a first solar cell, the first solar cell having a light receiving surface and an opposite backside surface;

a second solar cell, the second solar cell having a light receiving surface and an opposite backside surface, the second solar cell having an electrical interconnection with the first solar cell, the electrical interconnection spanning a gap present between the first solar cell and the second solar cell, the electrical interconnection positioned adjacent to the opposite backside surface of the first solar cell and the second solar cell; and a composite mask covering the electrical interconnection, the composite mask positioned at least partially in front of the light receiving surface of the first solar cell and the second solar cell, the composite mask comprising a transparent layer coupled to a surface of the first solar cell and the second solar cell and an opaque layer, wherein the transparent layer comprises a tape.

16. The photovoltaic array of claim 15 wherein the opaque layer comprises an ink positioned on a surface of the transparent layer.

17. The photovoltaic layer of claim 16 wherein the ink is applied to the tape using inkjet application methods or roller technology or both.

18. The photovoltaic layer of claim 15 wherein the composite mask spans an entire edge of the first solar cell or the second solar cell.

19. The photovoltaic layer of claim 15 wherein the first solar cell and the second solar cell are resident in a photovoltaic laminate.

20. The photovoltaic layer of claim 15 wherein the first solar cell and the second solar cell are members of a string of solar cells, the string of solar cells connected together in series.

* * * * *